(12) United States Patent
Miyake et al.

(10) Patent No.: US 11,798,823 B2
(45) Date of Patent: Oct. 24, 2023

(54) LIGHT IRRADIATION TYPE THERMAL PROCESS APPARATUS USING A GAS RING

(71) Applicant: SCREEN Holdings Co., Ltd., Kyoto (JP)

(72) Inventors: Hiroshi Miyake, Kyoto (JP); Kazuhiko Fuse, Kyoto (JP); Akitsugu Ueda, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 439 days.

(21) Appl. No.: 17/075,739

(22) Filed: Oct. 21, 2020

(65) Prior Publication Data

US 2021/0151335 A1 May 20, 2021

(30) Foreign Application Priority Data

Nov. 18, 2019 (JP) .................................. 2019-208023

(51) Int. Cl.
*H01L 21/67* (2006.01)
*H05B 3/00* (2006.01)

(52) U.S. Cl.
CPC .. *H01L 21/67115* (2013.01); *H01L 21/67109* (2013.01); *H05B 3/0047* (2013.01)

(58) Field of Classification Search
CPC ......... H01L 21/67115; H01L 21/67109; H01L 21/6719; H01L 21/68742; H01L 21/68; H01L 21/68714; H01L 21/67017; H05B 3/0047; F27D 2007/023; F27D 7/06;
(Continued)

(56) References Cited

U.S. PATENT DOCUMENTS

2006/0291832 A1* 12/2006 Ito ..................... H01L 21/67115
392/416
2018/0337076 A1* 11/2018 Nishide ............... H01L 21/6719

FOREIGN PATENT DOCUMENTS

| JP | 2000-228370 A | 8/2000 |
| JP | 2011-077143 A | 4/2011 |
| JP | 2011077143 A * | 4/2011 |

(Continued)

OTHER PUBLICATIONS

Request for the Submission of an Opinion dated Jul. 5, 2022 in corresponding Korean Patent Application No. 10-2020-0153649 and a computer generated English translation obtained from the JPO.
(Continued)

*Primary Examiner* — John P. Dulka
(74) *Attorney, Agent, or Firm* — OSTROLENK FABER LLP

(57) ABSTRACT

A gas ring is attached to an upper portion of a chamber side portion as a side wall of a chamber. The gas ring is formed by overlapping an upper ring and a lower ring. A gap between the upper ring and the lower ring provides a flow path for processing gas. A labyrinthine resisting unit is formed in the flow path. The mass of the lower ring having an inner wall surface is increased to increase heat capacity. The lower ring is attached to the chamber side portion to be in surface contact with the chamber side portion, so that thermal conductivity from the lower ring to the chamber side portion has a large value, and the amount of heat accumulated in the lower ring is reduced. An increase in temperature of the lower ring at thermal processing is thereby suppressed to prevent discoloration of the gas ring.

7 Claims, 9 Drawing Sheets

(58) Field of Classification Search
CPC .. F27D 5/0037; F27D 2009/0008; F27D 7/02; F27B 17/0025
See application file for complete search history.

(56) References Cited

FOREIGN PATENT DOCUMENTS

| | | |
|---|---|---|
| JP | 2011-187786 A | 9/2011 |
| JP | 2013-161936 A | 8/2013 |
| JP | 2018-195686 A | 12/2018 |
| JP | 2019-165157 A | 9/2019 |
| KR | 10-2006-0114657 A | 11/2006 |
| KR | 10-2008-0035284 A | 4/2008 |
| KR | 10-2018-0126377 A | 11/2018 |

OTHER PUBLICATIONS

Notification of Reason for Refusal dated Mar. 22, 2022 in corresponding Korean Patent Application No. 10-2020-0153649 and a computer generated English translation obtained from the JPO.
Notice of Reasons for Refusal dated Apr. 18, 2023 in corresponding Japanese Patent Application No. 2019-208023 and a computer generated English translation obtained from the JPO.

\* cited by examiner

F I G. 1 2
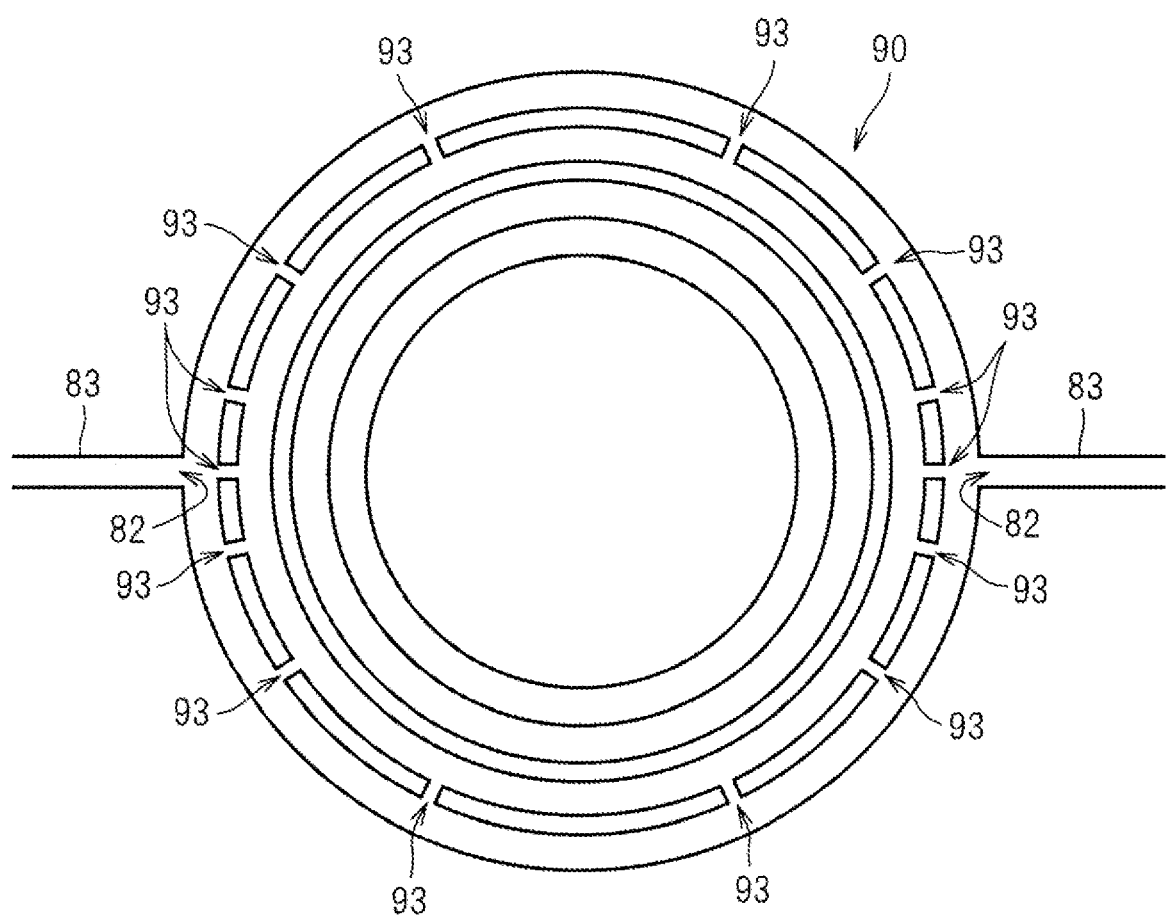

LIGHT IRRADIATION TYPE THERMAL PROCESS APPARATUS USING A GAS RING

BACKGROUND OF THE INVENTION

Field of the Invention

The present invention relates to a thermal processing apparatus irradiating a laminar precision electronic substrate (hereinafter, simply referred to as a "substrate"), such as a semiconductor wafer, with light to heat the substrate.

Description of the Background Art

In a process of manufacturing a semiconductor device, flash lamp annealing (FLA) to heat a semiconductor wafer in an extremely short time is attracting attention. FLA is a thermal processing technique of irradiating a surface of the semiconductor wafer with flashes of light using xenon flash lamps (a simple term "flash lamp" hereinafter refers to a xenon flash lamp) to increase the temperature on only the surface of the semiconductor wafer in an extremely short time (a few milliseconds or less).

Radiation spectral distribution of a xenon flash lamp is in an ultraviolet range to a near infrared range, has a shorter wavelength than that of a conventional halogen lamp, and is substantially coincident with a fundamental absorption band of a semiconductor wafer made of silicon. Thus, when the semiconductor wafer is irradiated with flashes of light from the xenon flash lamps, the temperature of the semiconductor wafer can rapidly be increased with less light being transmitted therethrough. Flash light irradiation in an extremely short time of a few milliseconds or less is also found to be able to selectively increase the temperature of only a portion near the surface of the semiconductor wafer.

Such FLA is used in processing in which heating in an extremely short time is required, and is typically used for activation of impurities implanted into the semiconductor wafer, for example. When a surface of the semiconductor wafer into which impurities have been implanted by ion implantation is irradiated with flashes of light from the flash lamps, the temperature on the surface of the semiconductor wafer can be increased to an activation temperature only in an extremely short time, and only activation of the impurities can be performed without diffusing the impurities to a greater depth.

As a thermal processing apparatus including such xenon flash lamps, US 2018/0337076 discloses a thermal processing apparatus including flash lamps on a side of a front surface of a semiconductor wafer and continuous illumination lamps, such as halogen lamps, on a side of a back surface of the semiconductor wafer, and performing desired thermal processing using them in combination. In the thermal processing apparatus disclosed in US 2018/0337076, the semiconductor wafer is preheated to a certain temperature by the halogen lamps, and then the temperature of the front surface of the wafer is increased to a desired processing temperature through flash light irradiation by the flash lamps.

US 2018/0337076 also discloses that the thermal processing apparatus includes a gas ring having a labyrinthine flow path to uniformly supply a large flow of processing gas from the gas ring to a chamber.

In the flash lamp annealing apparatus, the surface of the semiconductor wafer is sometimes heated to 1000° C. or more, and thus parts in the chamber, such as the above-mentioned gas ring, are heated to a moderately high temperature. If the temperature at preheating by the halogen lamps is approximately 600° C. to 700° C., an increase in temperature of the parts is not a problem. With growing demand for processing at a higher temperature in recent years, however, the preheat temperature exceeds 800° C. in some cases. When the preheat temperature exceeds 800° C., the gas ring in the chamber is heated to a high temperature to cause a problem in that the surface of the gas ring is discolored. Once the surface of the gas ring is discolored, reflectivity of the surface is reduced, so that illuminance of flashes of light applied to the semiconductor wafer at flash light irradiation can be reduced to prevent the temperature on the surface of the wafer from reaching a predetermined processing temperature.

SUMMARY

The present invention is directed to a thermal processing apparatus irradiating a substrate with light to heat the substrate.

In one aspect of the present invention, a thermal processing apparatus includes: a chamber having a cylindrical side wall; a holding unit for holding the substrate in the chamber; a light irradiation unit irradiating the substrate held by the holding unit with light; an annular gas ring attached to the side wall and directing processing gas supplied from outside the chamber into the chamber; and a cooling mechanism cooling the side wall, wherein the gas ring includes an annular first ring and an annular second ring, a gap between the first ring and the second ring provides a flow path for the processing gas, the second ring has a cylindrical inner wall surface having a smaller diameter than the side wall, and at least the second ring is in surface contact with the side wall.

Thermal conductivity from the second ring to the side wall is high, so that the second ring is effectively cooled to suppress an increase in temperature of the second ring to thereby prevent discoloration of the gas ring.

The second ring is preferably of a solid material.

The second ring has a large mass, so that heat capacity of the second ring has a large value to suppress the increase in temperature of the second ring to thereby prevent discoloration of the gas ring.

A labyrinthine resisting unit for reducing flow velocity of the processing gas is preferably located in the flow path between the first ring and the second ring.

The processing gas can uniformly be supplied to the chamber.

The gas ring preferably has a plurality of introduction holes for introducing, to the resisting unit, the processing gas supplied through a gas supply inlet from outside the chamber, and intervals at which the plurality of introduction holes are arranged increases with increasing distance from the gas supply inlet.

The processing gas can uniformly be introduced to the resisting unit.

In another aspect of the present invention, a thermal processing apparatus includes: a chamber having a cylindrical side wall; a holding unit for holding the substrate in the chamber; a light irradiation unit irradiating the substrate held by the holding unit with light; an annular gas ring attached to the side wall and directing processing gas supplied from outside the chamber into the chamber; and a cooling mechanism cooling the side wall, wherein the gas ring includes an annular first ring and an annular second ring, a gap between the first ring and the second ring provides a flow path for the processing gas, the second ring has a cylindrical inner wall surface having a smaller diameter than the side wall, and heat capacity of the second ring and thermal conductivity from the second ring to the side wall have values not causing discoloration of the inner wall surface of the second ring through light irradiation by the light irradiation unit.

Discoloration of the gas ring can be prevented.

It is thus an object of the present invention to prevent discoloration of a gas ring.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 illustrates a positional relationship between gas supply inlets and introduction holes.

DESCRIPTION OF THE PREFERRED EMBODIMENTS

An embodiment of the present invention will be described in details below with reference to the drawings.

Figure 1:
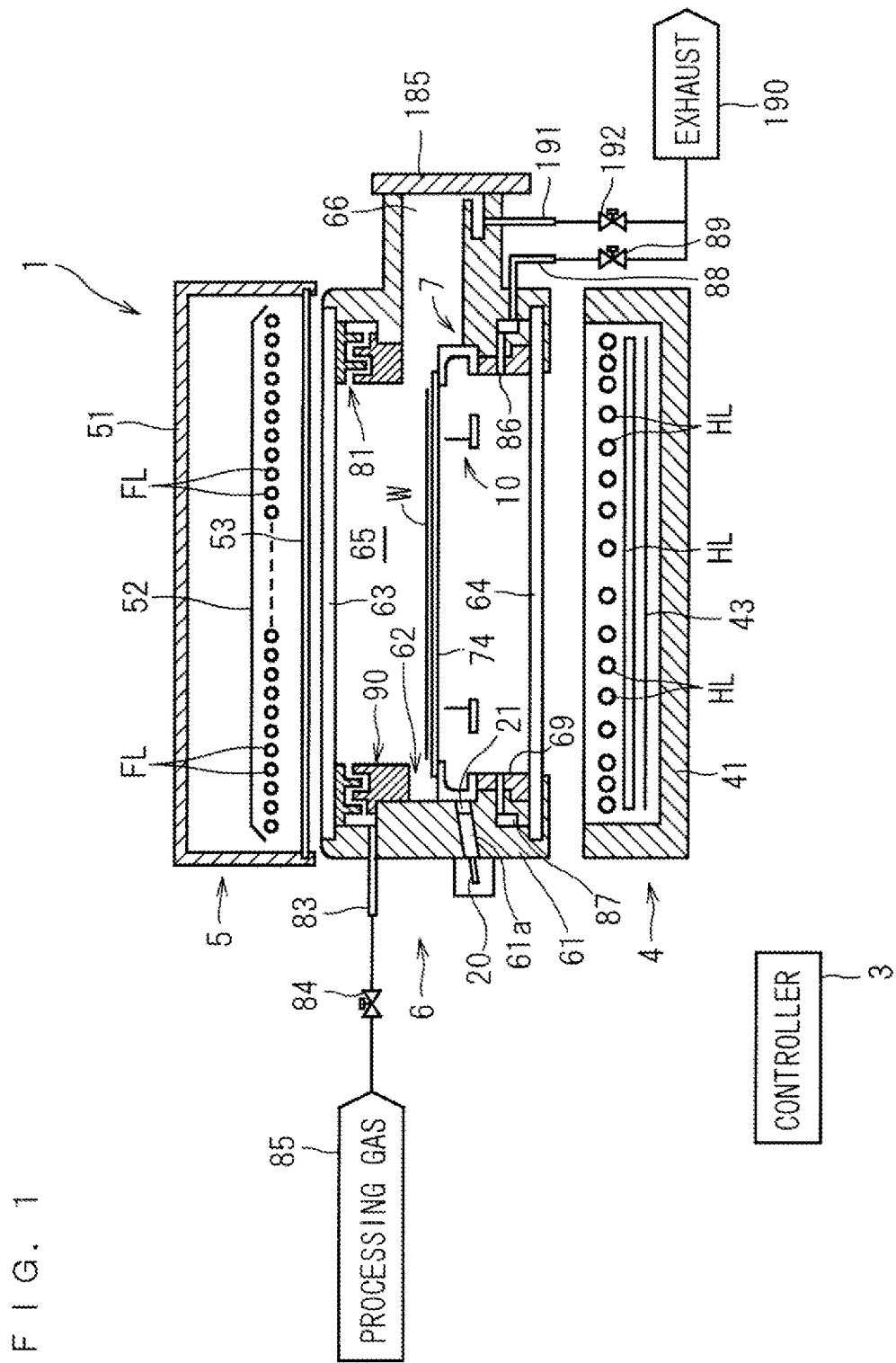
FIG. 1 is a longitudinal sectional view illustrating a configuration of a thermal processing apparatus according to the present invention.

FIG. 1 is a longitudinal sectional view illustrating a configuration of a thermal processing apparatus 1 according to the present invention. The thermal processing apparatus 1 in FIG. 1 is a flash lamp annealing apparatus irradiating a disk-shaped semiconductor wafer W as a substrate with flashes of light to heat the semiconductor wafer W. The size of the semiconductor wafer W to be processed is not particularly limited, but the semiconductor wafer W has a diameter of 300 mm or 450 mm (300 mm in the present embodiment), for example. Impurities have been implanted into the semiconductor wafer W before transportation to the thermal processing apparatus 1, and the implanted impurities are to be activated by heating performed by the thermal processing apparatus 1. In FIG. 1 and the drawings thereafter, dimensions and the number of components are exaggerated or simplified as necessary for ease of understanding.

The thermal processing apparatus 1 includes a chamber 6 for storing the semiconductor wafer W, a flash heating unit 5 incorporating a plurality of flash lamps FL, and a halogen heating unit 4 incorporating a plurality of halogen lamps HL. The flash heating unit 5 is provided above the chamber 6, and the halogen heating unit 4 is provided below the chamber 6. The thermal processing apparatus 1 also includes, within the chamber 6, a holding unit 7 for holding the semiconductor wafer W in a horizontal position and a transfer mechanism 10 for transferring the semiconductor wafer W between the holding unit 7 and the outside of the apparatus. The thermal processing apparatus 1 further includes a controller 3 controlling each operation mechanism provided in the halogen heating unit 4, the flash heating unit 5, and the chamber 6 to perform thermal processing of the semiconductor wafer W.

The chamber 6 includes a tubular chamber side portion 61 and chamber windows made of quartz attached to the top and bottom of the chamber side portion 61. The chamber side portion 61 has a substantially cylindrical shape with its top and bottom opened. An upper chamber window 63 is attached to an upper opening for blocking, and a lower chamber window 64 is attached to a lower opening for blocking. The upper chamber window 63 forming a ceiling of the chamber 6 is a disk-shaped member made of quartz, and functions as a quartz window transmitting flashes of light emitted from the flash heating unit 5 to the inside of the chamber 6. The lower chamber window 64 forming a floor of the chamber 6 is also a disk-shaped member made of quartz, and functions as a quartz window transmitting light emitted from the halogen heating unit 4 to the inside of the chamber 6.

A gas ring 90 is attached to an upper portion of an inner wall surface of the chamber side portion 61, and a reflective ring 69 is attached to a lower portion of the inner wall surface of the chamber side portion 61. The gas ring 90 and the reflective ring 69 are each formed to be annular. A space inside the chamber 6, that is, a space enclosed by the upper chamber window 63, the lower chamber window 64, the chamber side portion 61, the reflective ring 69, and the gas ring 90 is defined as a thermal processing space 65.

By attaching the reflective ring 69 and the gas ring 90 to the chamber side portion 61, a recess 62 is formed in the inner wall surface of the chamber 6. That is to say, the recess 62 surrounded by a middle portion of the inner wall surface of the chamber side portion 61 to which the reflective ring 69 and the gas ring 90 have not been attached, an upper end surface of the reflective ring 69, and a lower end surface of the gas ring 90 is formed. The recess 62 is formed in the inner wall surface of the chamber 6 to be annular along the horizontal direction, and surrounds the holding unit 7 for holding the semiconductor wafer W.

A transport opening (furnace mouth) 66 to transport the semiconductor wafer W to and from the chamber 6 is formed in the chamber side portion 61. The transport opening 66 is openable and closable by a gate valve 185. The transport opening 66 is connected in communication with an outer circumferential surface of the recess 62. The semiconductor wafer W can thus be transported from the transport opening 66 to the thermal processing space 65 through the recess 62 and be transported from the thermal processing space 65 when the gate valve 185 opens the transport opening 66. The thermal processing space 65 inside the chamber 6 becomes an enclosed space when the gate valve 185 closes the transport opening 66.

Furthermore, the chamber side portion 61 has a through hole 61a. A radiation thermometer 20 is attached to a portion of an outer wall surface of the chamber side portion 61 where the through hole 61a is provided. The through hole 61a is a cylindrical hole for directing infrared light radiated from a lower surface of the semiconductor wafer W held by the susceptor 74, which will be described below, to the radiation thermometer 20. The through hole 61a is inclined with respect to the horizontal direction so that an axis thereof in a direction of penetration crosses the main surface of the semiconductor wafer W held by the susceptor 74. A transparent window 21 made of a barium fluoride material transmitting infrared light in a wavelength region allowing for measurement by the radiation thermometer 20 is attached to an end of the through hole 61*a* facing the thermal processing space 65.

A gas discharge outlet 81 for supplying processing gas to the thermal processing space 65 is formed in the gas ring 90 attached to an upper portion of an inner wall of the chamber 6. The gas discharge outlet 81 is connected in communication with gas supply tubes 83 through an internal space of the gas ring 90. The gas supply tubes 83 are connected to a processing gas supply source 85. A valve 84 is inserted along a path of the gas supply tubes 83. When the valve 84 is opened, the processing gas is supplied from the processing gas supply source 85 to the gas ring 90, and the processing gas having passed through the internal space of the gas ring 90 is discharged through the gas discharge outlet 81 to the thermal processing space 65. As the processing gas, inert gas, such as nitrogen ($N_2$), reactive gas, such as hydrogen ($H_2$) and ammonia ($NH_3$), or mixed gas as a mixture of them can be used (nitrogen gas in the present embodiment). A configuration of the gas ring 90 will further be described below.

On the other hand, a gas exhaust hole 86 for exhausting gas within the thermal processing space 65 is formed in a lower portion of the inner wall of the chamber 6. The gas exhaust hole 86 is located below the recess 62, and may be formed in the reflective ring 69. The gas exhaust hole 86 is connected in communication with a gas exhaust tube 88 through a buffer space 87 formed to be annular inside a side wall of the chamber 6. The gas exhaust tube 88 is connected to an exhaust unit 190. A valve 89 is inserted along a path of the gas exhaust tube 88. When the valve 89 is opened, gas within the thermal processing space 65 is exhausted from the gas exhaust hole 86 to the gas exhaust tube 88 through the buffer space 87. The processing gas supply source 85 and the exhaust unit 190 may each be a mechanism provided in the thermal processing apparatus 1, and may each be a utility of a plant in which the thermal processing apparatus 1 is installed.

A gas exhaust tube 191 for exhausting gas within the thermal processing space 65 is also connected to a leading end of the transport opening 66. The gas exhaust tube 191 is connected to the exhaust unit 190 through a valve 192. Gas within the chamber 6 is exhausted through the transport opening 66 by opening the valve 192.

Figure 2:
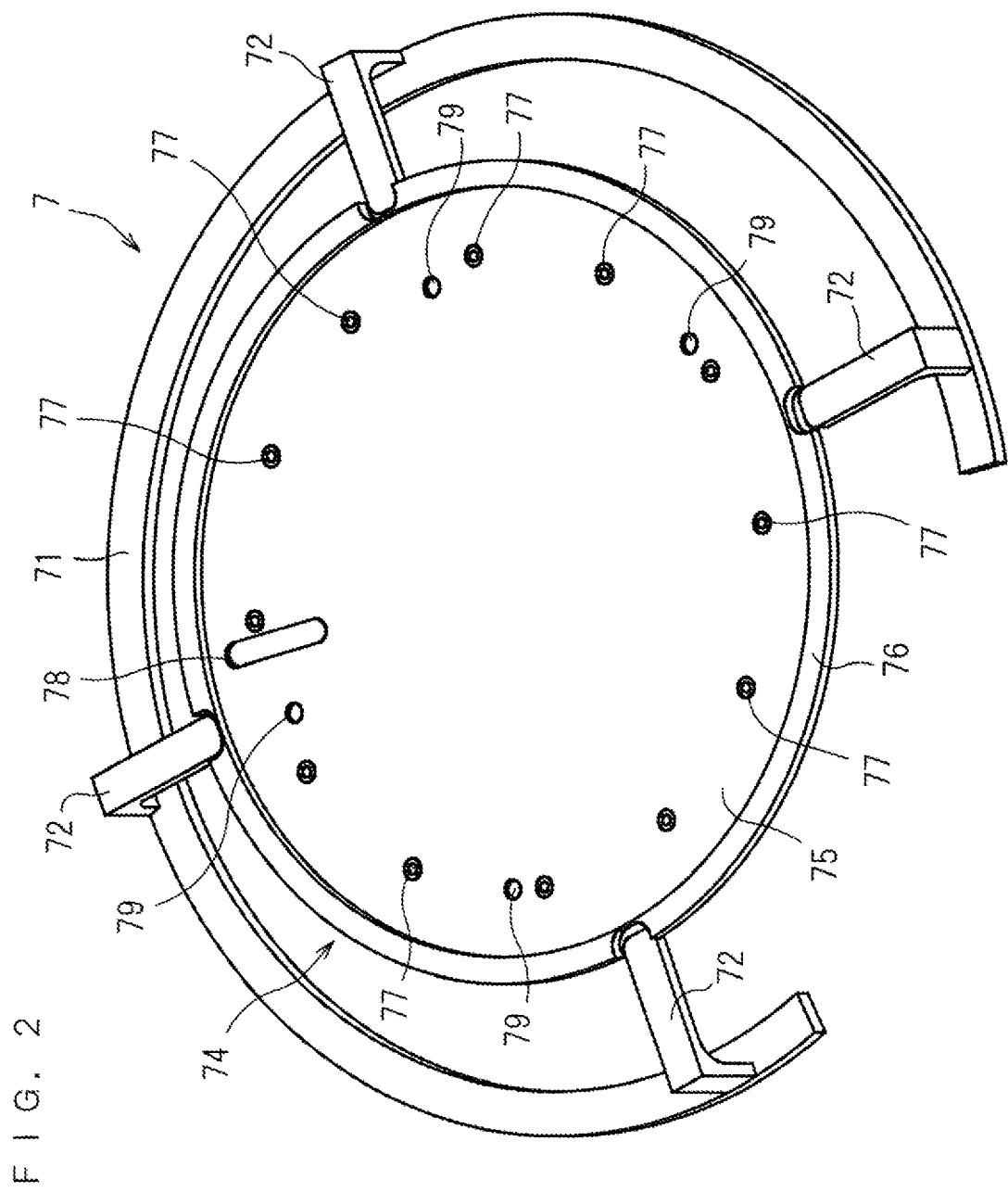
FIG. 2 is a perspective view illustrating appearance of a holding unit as a whole.

FIG. 2 is a perspective view illustrating appearance of the holding unit 7 as a whole. The holding unit 7 includes a base ring 71, connectors 72, and the susceptor 74. The base ring 71, the connectors 72, and the susceptor 74 are each made of quartz. That is to say, the holding unit 7 as a whole is made of quartz.

The base ring 71 is a quartz member having an arc shape that is a partially-missing annular shape. The missing portion is provided to prevent interference between transfer arms 11 of the transfer mechanism 10, which will be described below, and the base ring 71. The base ring 71 is mounted on a bottom surface of the recess 62 to be supported by a wall surface of the chamber 6 (see FIG. 1). The plurality of connectors 72 (four connectors 72 in the present embodiment) are provided to stand on an upper surface of the base ring 71 along a circumferential direction of the annular shape thereof. The connectors 72 are also quartz members, and are fixed to the base ring 71 by welding.

Figure 3:
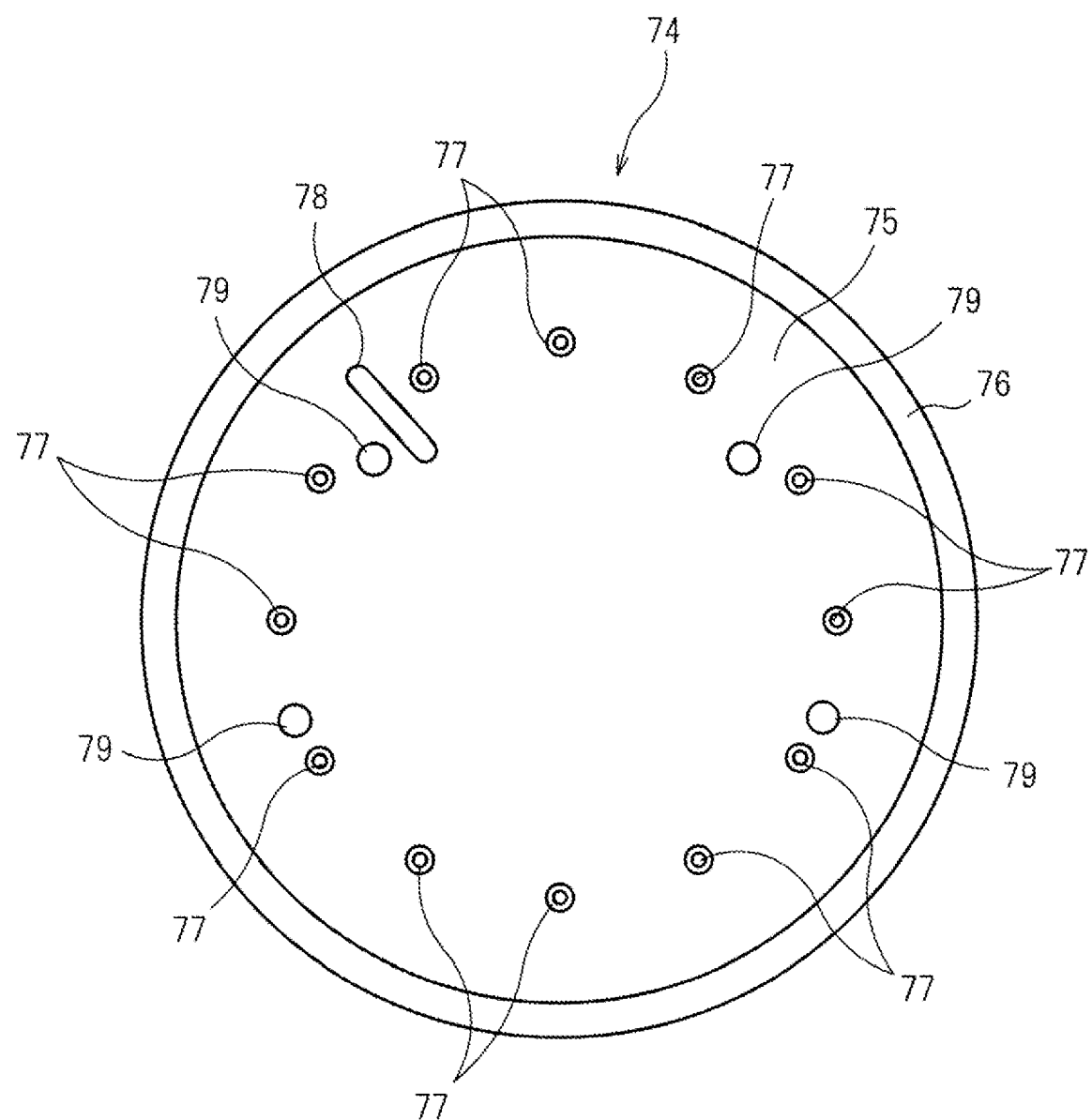
FIG. 3 is a plan view of a susceptor.
Figure 4:
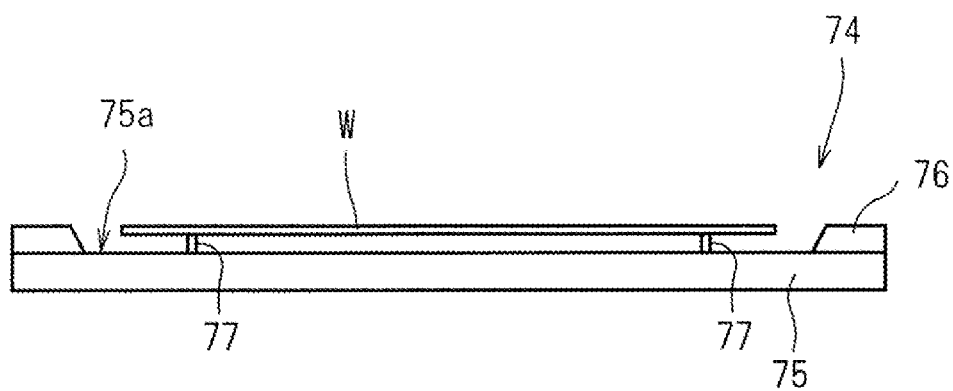
FIG. 4 is a sectional view of the susceptor.

The susceptor 74 is supported by the four connectors 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a substantially circular planar member made of quartz. The holding plate 75 has a greater diameter than the semiconductor wafer W. That is to say, the holding plate 75 has a greater planar size than the semiconductor wafer W.

The guide ring 76 is provided at a periphery on an upper surface of the holding plate 75. The guide ring 76 is an annular member having an inner diameter greater than the diameter of the semiconductor wafer W. For example, the guide ring 76 has an inner diameter of 320 mm in a case where the semiconductor wafer W has a diameter of 300 mm. An inner circumference of the guide ring 76 is a tapered surface widening upward from the holding plate 75. The guide ring 76 is made of quartz as with the holding plate 75. The guide ring 76 may be welded onto the upper surface of the holding plate 75 or may be fixed to the holding plate 75 with pins and the like processed separately. Alternatively, the holding plate 75 and the guide ring 76 may be processed as an integral member.

A region of the upper surface of the holding plate 75 inside the guide ring 76 is a planar holding surface 75*a* for holding the semiconductor wafer W. The plurality of substrate support pins 77 are provided to stand on the holding surface 75*a* of the holding plate 75. In the present embodiment, a total of 12 substrate support pins 77 are provided at 30° intervals to stand on a circumference of a circle concentric with an outer circumference of the holding surface 75*a* (the inner circumference of the guide ring 76). The diameter of the circle on which the 12 substrate support pins 77 are arranged (the distance between opposite substrate support pins 77) is smaller than the diameter of the semiconductor wafer W, and is 270 mm to 280 mm (270 mm in the present embodiment) if the semiconductor wafer W has a diameter of 300 mm. The substrate support pins 77 are each made of quartz. The plurality of substrate support pins 77 may be provided on the upper surface of the holding plate 75 by welding, or may processed to be integral with the holding plate 75.

Referring back to FIG. 2, the four connectors 72 provided to stand on the base ring 71 and the periphery of the holding plate 75 of the susceptor 74 are fixed to each other by welding. That is to say, the susceptor 74 and the base ring 71 are fixedly connected to each other by the connectors 72. The base ring 71 of the holding unit 7 as described above is supported by the wall surface of the chamber 6, so that the holding unit 7 is attached to the chamber 6. When the holding unit 7 is in a state of being attached to the chamber 6, the holding plate 75 of the susceptor 74 is in the horizontal position (in a position in which a normal thereto is coincident with the vertical direction). That is to say, the holding surface 75*a* of the holding plate 75 is a horizontal surface.

The semiconductor wafer W transported to the chamber 6 is mounted and held on the susceptor 74 of the holding unit 7 attached to the chamber 6 in the horizontal position. In this case, the semiconductor wafer W is supported by the 12 substrate support pins 77 provided to stand on the holding plate 75 to be held by the susceptor 74. More strictly, upper ends of the 12 substrate support pins 77 are in contact with the lower surface of the semiconductor wafer W to support the semiconductor wafer W. The 12 substrate support pins 77 have a uniform height (a uniform distance from the upper ends of the substrate support pins 77 to the holding surface 75*a* of the holding plate 75), and thus can support the semiconductor wafer W in the horizontal position.

The semiconductor wafer W is supported by the plurality of substrate support pins 77 to be spaced apart from the holding surface 75*a* of the holding plate 75 by a predetermined distance. The thickness of the guide ring 76 is greater than the height of each of the substrate support pins 77. The guide ring 76 thus prevents misalignment in the horizontal direction of the semiconductor wafer W supported by the plurality of substrate support pins 77.

As illustrated in FIGS. 2 and 3, the holding plate 75 of the susceptor 74 has an opening 78 formed through the holding plate 75. The opening 78 is provided for the radiation thermometer 20 to receive light (infrared light) radiated from the lower surface of the semiconductor wafer W. That is to say, the radiation thermometer 20 receives light radiated from the lower surface of the semiconductor wafer W through the opening 78 and the transparent window 21 attached to the through hole 61a of the chamber side portion 61, and measures the temperature of the semiconductor wafer W. The holding plate 75 of the susceptor 74 further has four through holes 79 through which lift pins 12 of the transfer mechanism 10, which will be described below, are to penetrate for a transfer of the semiconductor wafer W.

Figure 5:
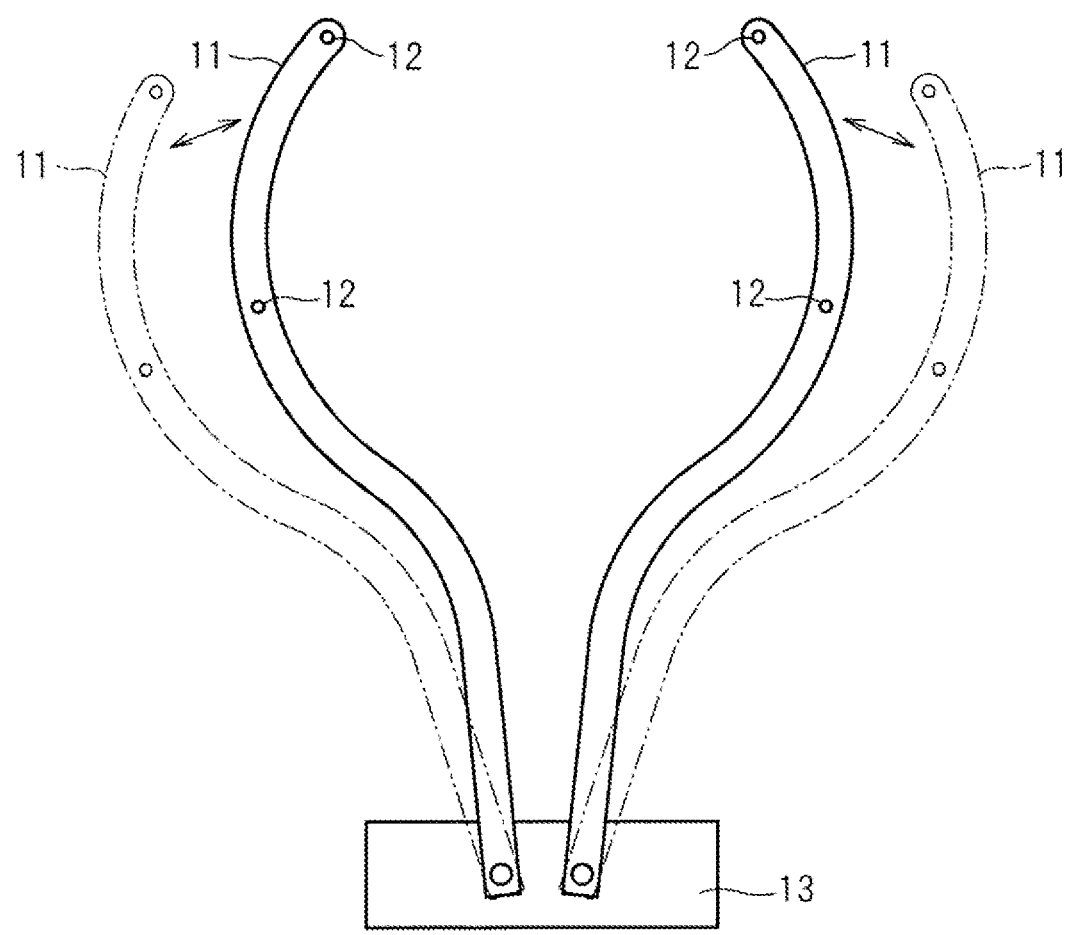
FIG. 5 is a plan view of a transfer mechanism.
Figure 6:
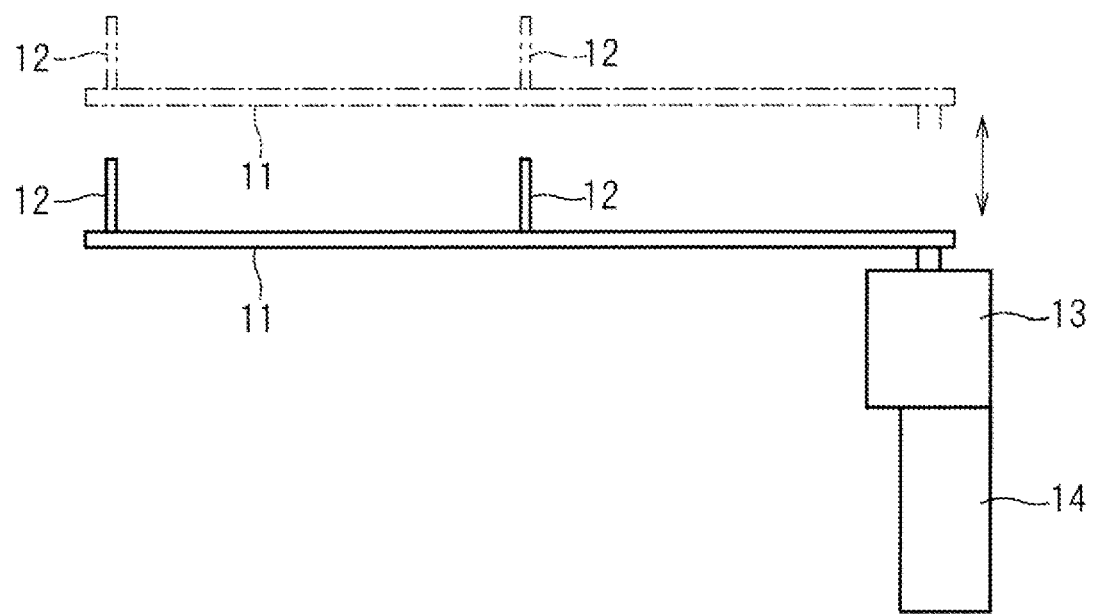
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 have an arc shape substantially along the recess 62 formed to be annular. Two lift pins 12 are provided to stand on each of the transfer arms 11. The transfer arms 11 and the lift pins 12 are each made of quartz. The transfer arms 11 are each rotatable by a horizontal movement mechanism 13. The horizontal movement mechanism 13 horizontally moves the pair of transfer arms 11 between a transfer operation location (a location in solid lines in FIG. 5) where the semiconductor wafer W is transferred to and from the holding unit 7 and a withdrawal location (a location in alternate long and two short dashes lines in FIG. 5) where the pair of transfer arms 11 does not overlap the semiconductor wafer W held by the holding unit 7 in plan view. The horizontal movement mechanism 13 may rotate the transfer arms 11 by separate motors, or may rotate the transfer arms 11 in conjunction with each other by a single motor using a link mechanism.

The pair of transfer arms 11 is moved upward and downward by a lift mechanism 14 along with the horizontal movement mechanism 13. When the lift mechanism 14 moves the pair of transfer arms 11 upward at the transfer operation location, a total of four lift pins 12 pass through the through holes 79 (see FIGS. 2 and 3) formed in the susceptor 74, and upper ends of the lift pins 12 protrude from the upper surface of the susceptor 74. On the other hand, when the lift mechanism 14 moves the pair of transfer arms 11 downward at the transfer operation location to draw the lift pins 12 from the through holes 79, and the horizontal movement mechanism 13 moves the pair of transfer arms 11 to open the transfer arms 11, the transfer arms 11 are moved to the withdrawal location. The withdrawal location of the pair of transfer arms 11 is immediately above the base ring 71 of the holding unit 7. The base ring 71 is mounted on the bottom surface of the recess 62, so that the withdrawal location of the transfer arms 11 is inside the recess 62. An exhaust mechanism, which is not illustrated, is provided near a portion where a drive unit (the horizontal movement mechanism 13 and the lift mechanism 14) of the transfer mechanism 10 is provided to exhaust an atmosphere around the drive unit of the transfer mechanism 10 to the outside of the chamber 6.

Referring back to FIG. 1, the flash heating unit 5 provided above the chamber 6 includes, within a housing 51, a light source composed of a plurality of xenon flash lamps FL (30 xenon flash lamps FL in the present embodiment) and a reflector 52 provided to cover the light source from above. A lamp light radiation window 53 is attached to the bottom of the housing 51 of the flash heating unit 5. The lamp light radiation window 53 forming a floor of the flash heating unit 5 is a plate-like quartz window made of quartz. The flash heating unit 5 is installed above the chamber 6, so that the lamp light radiation window 53 opposes the upper chamber window 63. The flash lamps FL irradiate the thermal processing space 65 with flashes of light from above the chamber 6 through the lamp light radiation window 53 and the upper chamber window 63.

The plurality of flash lamps FL are each a rod-like lamp having an elongated cylindrical shape, and are in planar arrangement so that longitudinal directions thereof are parallel to each other along the main surface of the semiconductor wafer W held by the holding unit 7 (i.e., along the horizontal direction). A plane formed by arrangement of the flash lamps FL is thus a horizontal plane. A region where the plurality of flash lamps FL are arranged has a greater planar size than the semiconductor wafer W.

Each of the xenon flash lamps FL includes a cylindrical glass tube (discharge tube) in which xenon gas is enclosed and which has, at opposite ends thereof, an anode and a cathode connected to a capacitor, and a trigger electrode attached to an outer circumferential surface of the glass tube. Xenon gas is electrically an insulator, so that electricity does not flow through the glass tube in a normal state even if electric charge is accumulated in the capacitor. In a case where a high voltage is applied to the trigger electrode to cause electrical breakdown, however, electricity stored in the capacitor instantaneously flows through the glass tube, and light is emitted by excitation of atoms or molecules of xenon at the time. In such a xenon flash lamp FL, electrostatic energy stored in advance in the capacitor is converted into an extremely short light pulse of 0.1 ms to 100 ms. The xenon flash lamp FL thus has a feature of being capable of emitting extremely intense light compared with a continuous illumination light source, such as a halogen lamp HL. That is to say, the flash lamp FL is a pulsed light emitting lamp momentarily emitting light in an extremely short time of less than one second. A light emitting time of the flash lamp FL can be adjusted by a coil constant of a lamp power supply supplying power to the flash lamp FL.

The reflector 52 is provided above the plurality of flash lamps FL to cover the flash lamps FL as a whole. A basic function of the reflector 52 is to reflect flashes of light emitted from the plurality of flash lamps FL toward the thermal processing space 65. The reflector 52 is formed of an aluminum alloy plate, and has a front surface (a surface facing the flash lamps FL) having been roughened by blasting.

The halogen heating unit 4 provided below the chamber 6 incorporates the plurality of halogen lamps HL (40 halogen lamps HL in the present embodiment) in a housing 41. The halogen heating unit 4 is a light irradiation unit irradiating the thermal processing space 65 with light from below the chamber 6 through the lower chamber window 64 using the plurality of halogen lamps HL to heat the semiconductor wafer W.

Figure 7:
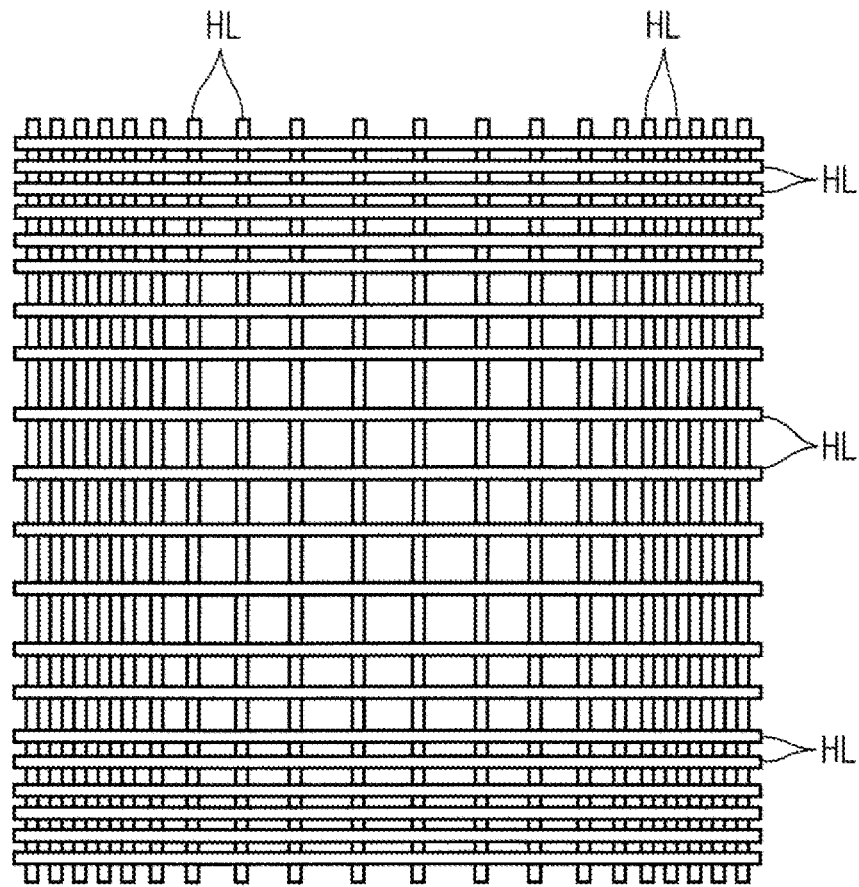
FIG. 7 is a plan view illustrating arrangement of a plurality of halogen lamps.

FIG. 7 is a plan view illustrating arrangement of the plurality of halogen lamps HL. The 40 halogen lamps HL are arranged separately in two tiers. In an upper tier closer to the holding unit 7, 20 halogen lamps HL are arranged, and, in a lower tier farther from the holding unit 7 than the upper tier is, 20 halogen lamps HL are arranged. The halogen lamps HL are each a rod-like lamp having an elongated cylindrical shape. The 20 halogen lamps HL in each of the upper and lower tiers are arranged so that longitudinal directions thereof are parallel to each along the main surface of the semiconductor wafer W held by the holding unit 7 (i.e., along the horizontal direction). A plane formed by arrangement of the halogen lamps HL in each of the upper and lower tiers is thus a horizontal plane.

As illustrated in FIG. 7, the halogen lamps HL arranged in each of the upper and lower tiers are denser in a region opposing the periphery of the semiconductor wafer W held by the holding unit 7 than in a region opposing a central portion of the semiconductor wafer W held by the holding unit 7. That is to say, the halogen lamps HL arranged in each of the upper and lower tiers have a shorter pitch at the periphery than in a central portion of arrangement of the lamps. The periphery of the semiconductor wafer W where a decrease in temperature is more likely to occur at heating through light irradiation by the halogen heating unit 4 can thus be irradiated with a greater amount of light.

The halogen lamps HL are arranged so that the halogen lamps HL in the upper tier and the halogen lamps HL in the lower tier intersect with each other in a grid. That is to say, a total of 40 halogen lamps HL are arranged so that longitudinal directions of the 20 halogen lamps HL arranged in the upper tier and longitudinal directions of the 20 halogen lamps HL arranged in the lower tier are orthogonal to each other.

Each of the halogen lamps HL is a filament light source causing a filament disposed inside a cylindrical glass tube to glow by allowing current to pass therethrough to thereby emit light. Gas obtained by introducing traces of halogen elements (e.g., iodide and bromine) into inert gas, such as nitrogen and argon, is enclosed in the glass tube. Introduction of halogen elements allows for setting the temperature of the filament to a high temperature while suppressing breakage of the filament. The halogen lamp HL thus has a property of having a longer life and being capable of continuously emitting intense light compared with a typical incandescent lamp. That is to say, the halogen lamp HL is a continuous illumination lamp continuously emitting light for at least one second or more. The halogen lamps HL have long lives as they are rod-like lamps, and have excellent radiation efficiency toward the semiconductor wafer W above the halogen lamps HL by being arranged along the horizontal direction.

In the housing 41 of the halogen heating unit 4, a reflector 43 is also provided below the halogen lamps HL arranged in two tiers (FIG. 1). The reflector 43 reflects light emitted from the plurality of halogen lamps HL toward the thermal processing space 65.

Figure 8:
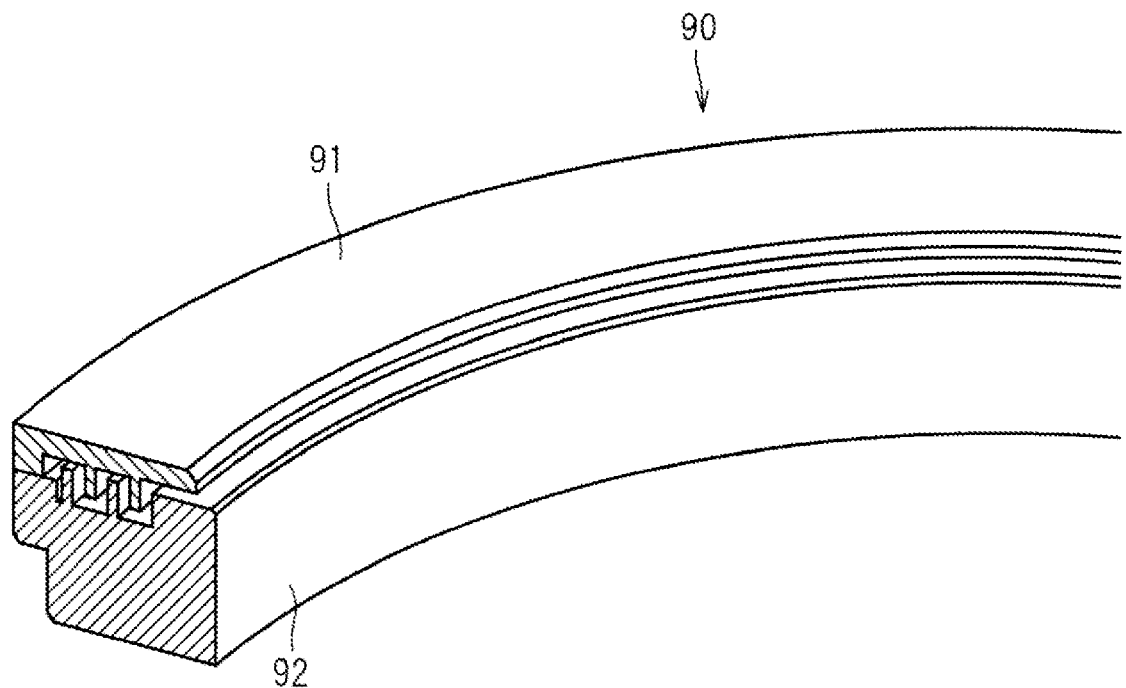
FIG. 8 is a perspective view illustrating a portion of a gas ring.
Figure 9:
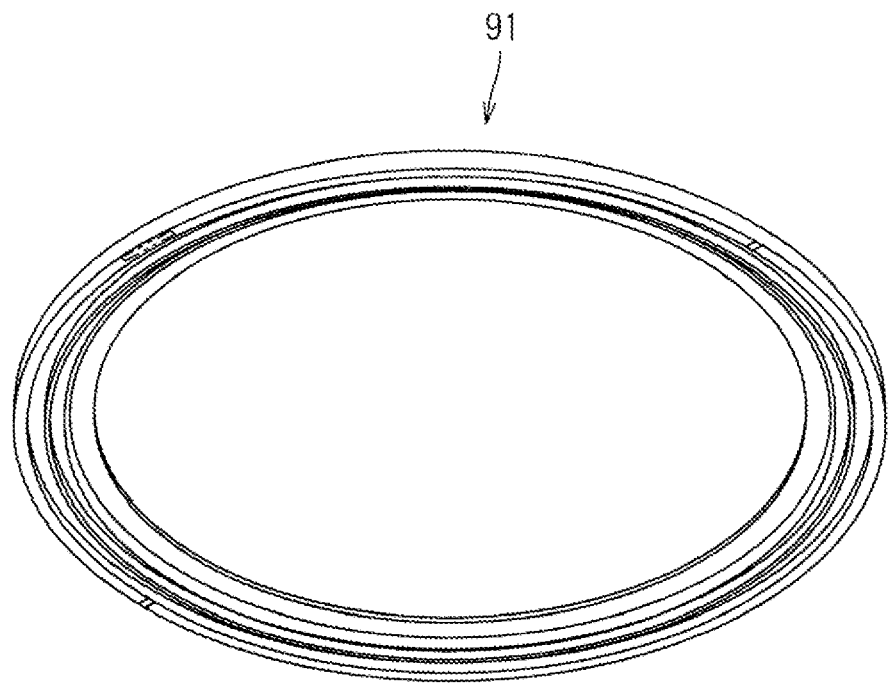
FIG. 9 is a perspective view illustrating appearance of an upper ring.
Figure 10:
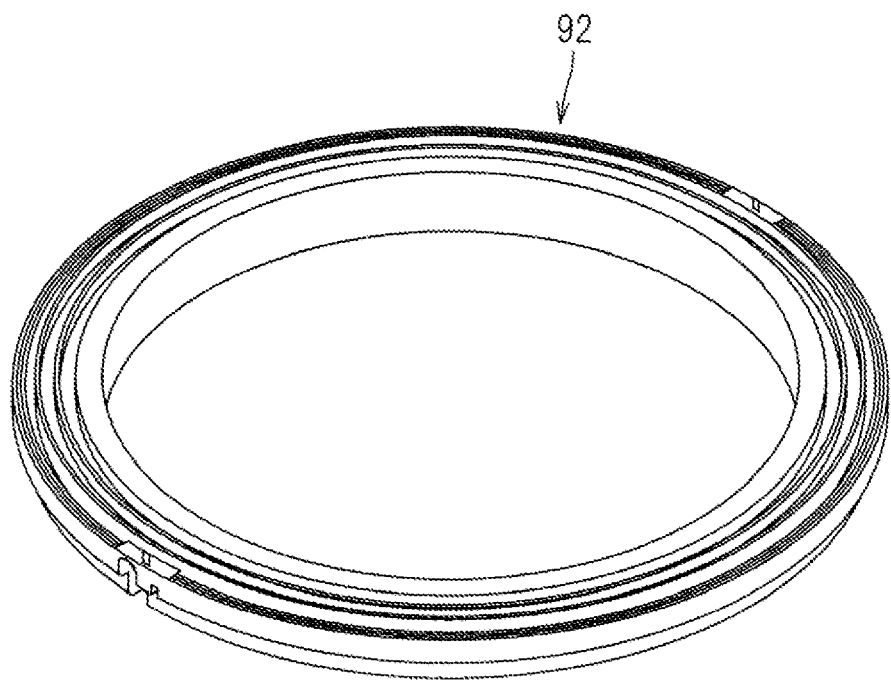
FIG. 10 is a perspective view illustrating appearance of a lower ring.

Description on the configuration of the gas ring 90 will be continued. FIG. 8 is a perspective view illustrating a portion of the gas ring 90. The gas ring 90 attached to the upper portion of the inner wall surface of the substantially cylindrical chamber side portion 61 is annular. The gas ring 90 is attached so that the center thereof is coincident with the center of the chamber side portion 61. That is to say, a radial direction and a circumferential direction of the gas ring 90 respectively match a radial direction and a circumferential direction of the chamber side portion 61. The gas ring 90 includes an upper ring (a first ring) 91 and a lower ring (a second ring) 92. FIG. 9 is a perspective view illustrating appearance of the upper ring 91. FIG. 10 is a perspective view illustrating appearance of the lower ring 92. The upper ring 91 and the lower ring 92 are each annular. The upper ring 91 and the lower ring 92 are overlapped to form the gas ring 90.

Figure 11:
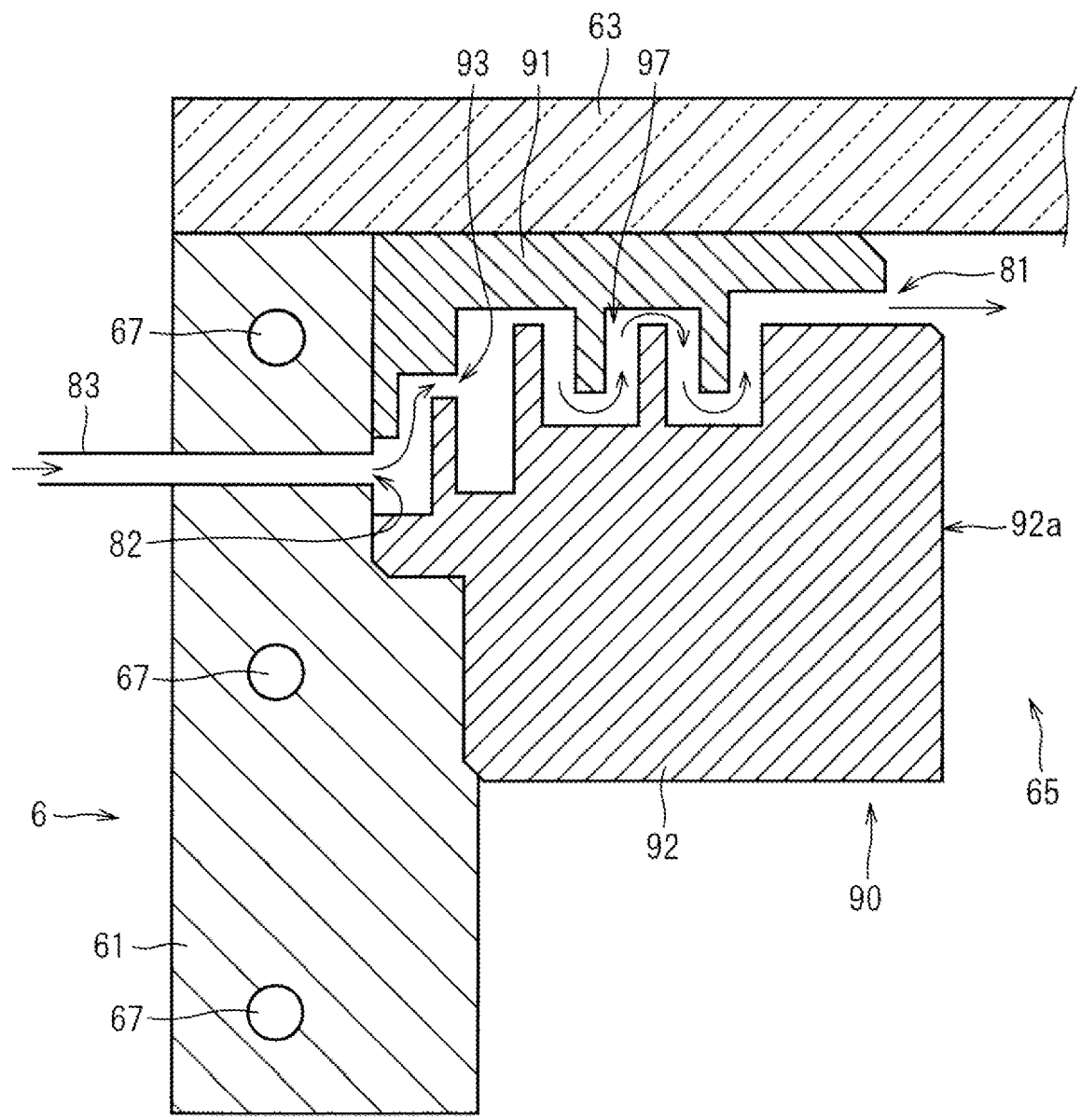
FIG. 11 is a sectional view of the gas ring attached to a chamber side portion.

FIG. 11 is a sectional view of the gas ring 90 attached to the chamber side portion 61. As illustrated in FIG. 11, the upper ring 91 and the lower ring 92 constituting the gas ring 90 are each attached to the chamber side portion 61 as the side wall of the chamber 6 to be in surface contact with the chamber side portion 61. Thermal conductivity between the upper ring 91 and the chamber side portion 61 and between the lower ring 92 and the chamber side portion 61 thus has a large value. A water-cooled tube 67 is provided to the chamber side portion 61 to extend along the chamber side portion 61. Cooling water is supplied from a cooling water supply mechanism, which is not illustrated, to the water-cooled tube 67. That is to say, the chamber side portion 61 is a water-cooled wall. The upper ring 91 and the lower ring 92 each attached to the chamber side portion 61 to be in surface contact with the chamber side portion 61 are cooled by supplying the cooling water to the water-cooled tube 67.

As illustrated in FIG. 11, the lower ring 92 has an inner wall surface 92a facing the thermal processing space 65. The inner wall surface 92a of the lower ring 92 is in the form of a cylinder having a smaller diameter than the chamber side portion 61. That is to say, the inner wall surface 92a of the lower ring 92 is located to be closer to the semiconductor wafer W held by the susceptor 74 than the chamber side portion 61 is. The inner wall surface 92a of the lower ring 92 has a diameter of 390 mm, for example. The lower ring 92 having the cylindrical inner wall surface 92a is of a solid material having no space therein, and has a greater mass than the upper ring 91.

In a structure in which the annular upper ring 91 and the annular lower ring 92 are overlapped, there is a gap between the upper ring 91 and the lower ring 92. The gap provides a flow path 97 directing the processing gas. A labyrinthine resisting unit is formed in the flow path 97. Specifically, the resisting unit is formed by combining a plurality of concentric cylindrical walls formed to protrude downward from the upper ring 91 and a plurality of concentric cylindrical walls formed to protrude upward from the lower ring 92 so that they interdigitate with each other with a predetermined distance therebetween. Such a labyrinthine resisting unit is formed, so that the flow path 97 is a path bent along the radial direction of the gas ring 90.

The processing gas supplied through the gas supply tubes 83 is supplied through gas supply inlets 82 to the flow path 97 in the gas ring 90. The processing gas having flowed through the gas supply inlets 82 to the flow path 97 is introduced to the resisting unit in the flow path 97 through a plurality of introduction holes 93. The processing gas having passed through the resisting unit in the flow path 97 is supplied through the gas discharge outlet 81 formed at a leading end of the flow path 97 to the thermal processing space 65 in the chamber 6.

FIG. 12 illustrates a positional relationship between the gas supply inlets 82 and the introduction holes 93. Two gas supply tubes 83 are connected to the annular gas ring 90 at opposite locations 180° away from each other. That is to say, two gas supply inlets 82 are provided at 180° intervals. The gas ring 90 has the plurality of introduction holes 93 for introducing, to the resisting unit in the flow path 97, the processing gas supplied through the two gas supply inlets 82. As illustrated in FIG. 12, intervals at which the plurality of introduction holes 93 are arranged increases with increasing distance from each of the gas supply inlets 82. By arranging the plurality of introduction holes 93 as described above, the processing gas supplied through the two gas supply inlets 82 can uniformly be directed to the flow path 97.

Referring back to FIG. 1, the controller 3 controls the above-mentioned various operation mechanisms provided in the thermal processing apparatus 1. The controller 3 has a similar hardware configuration to a typical computer. That is to say, the controller 3 includes a CPU as a circuit to perform various types of arithmetic processing, ROM as read-only memory for storing a basic program, RAM as read/write memory for storing various pieces of information, and a magnetic disk for storing control software, data, and the like. The CPU of the controller 3 executes a predetermined processing program to proceed with processing performed by the thermal processing apparatus 1.

Procedures of processing of the semiconductor wafer W performed by the thermal processing apparatus 1 will be described next. The semiconductor wafer W to be processed is herein a semiconductor substrate to which impurities (ions) have been added by ion implantation. The impurities are activated by flash light irradiation heating (annealing) performed by the thermal processing apparatus 1. The controller 3 controls each of the operation mechanisms of the thermal processing apparatus 1 to proceed with procedures of processing performed by the thermal processing apparatus 1 described below.

First, the valve 84 for supplying gas is opened, and the valve 89 and the valve 192 for exhausting gas are opened to start supply and exhaust of gas to and from the chamber 6. When the valve 84 is opened, nitrogen gas as the processing gas is supplied from the processing gas supply source 85 to the gas ring 90, and the nitrogen gas having passed through the internal space of the gas ring 90 is discharged through the gas discharge outlet 81 to the thermal processing space 65. When the valve 89 is opened, gas within the chamber 6 is exhausted from the gas exhaust hole 86. Nitrogen gas supplied from an upper portion of the thermal processing space 65 in the chamber 6 thereby flows downward, and is exhausted from a lower portion of the thermal processing space 65.

Gas within the chamber 6 is also exhausted through the transport opening 66 by opening the valve 192. Furthermore, the atmosphere around the drive unit of the transfer mechanism 10 is exhausted by the exhaust mechanism, which is not illustrated. When the thermal processing apparatus 1 performs thermal processing of the semiconductor wafer W, nitrogen gas is continuously supplied to the thermal processing space 65, and the amount of supply is changed as appropriate in accordance with a step of processing.

Then, the gate valve 185 is opened to open the transport opening 66, and a transport robot outside the apparatus transports the semiconductor wafer W after ion implantation to the thermal processing space 65 in the chamber 6 through the transport opening 66. In this case, an atmosphere outside the apparatus can be entrained with transportation of the semiconductor wafer W, but, since nitrogen gas is continuously supplied to the chamber 6, nitrogen gas flows out from the transport opening 66 to minimize such entrainment of the atmosphere outside the apparatus.

The semiconductor wafer W transported by the transport robot is moved to a location immediately above the holding unit 7, and is stopped. The pair of transfer arms 11 of the transfer mechanism 10 horizontally moves from the withdrawal location to the transfer operation location, and moves upward, so that the lift pins 12 pass through the through holes 79 to protrude from the upper surface of the holding plate 75 of the susceptor 74, and receive the semiconductor wafer W. In this case, the lift pins 12 are moved to a location above the upper ends of the substrate support pins 77.

After the semiconductor wafer W is mounted on the lift pins 12, the transport robot leaves the thermal processing space 65, and the transport opening 66 is closed by the gate valve 185. The pair of transfer arms 11 moves downward, so that the semiconductor wafer W is transferred from the transfer mechanism 10 to the susceptor 74 of the holding unit 7, and is held in the horizontal position from below. The semiconductor wafer W is held by the susceptor 74 by being supported by the plurality of substrate support pins 77 provided to stand on the holding plate 75. The semiconductor wafer W is held by the holding unit 7 with a surface in which patterns have been formed and into which the impurities have been implanted facing upward. There is a predetermined distance between a back surface (a main surface opposing the front surface) of the semiconductor wafer W supported by the plurality of substrate support pins 77 and the holding surface 75a of the holding plate 75. The pair of transfer arms 11 having moved downward to a location below the susceptor 74 is withdrawn by the horizontal movement mechanism 13 to the withdrawal location, that is, a location inside the recess 62.

After the semiconductor wafer W is held by the susceptor 74 of the holding unit 7 made of quartz in the horizontal position from below, the 40 halogen lamps HL of the halogen heating unit 4 are simultaneously turned on to start preheating (assist heating). Halogen light emitted from the halogen lamps HL is transmitted by the lower chamber window 64 and the susceptor 74 each made of quartz, and is applied to the lower surface of the semiconductor wafer W. By being irradiated with light from the halogen lamps HL, the semiconductor wafer W is preheated to have an increased temperature. The transfer arms 11 of the transfer mechanism 10 are withdrawn to the inside of the recess 62, and thus do not interfere with heating by the halogen lamps HL.

At preheating by the halogen lamps HL, the temperature of the semiconductor wafer W is measured by the radiation thermometer 20. That is to say, the radiation thermometer 20 receives, through the transparent window 21, infrared light radiated from the lower surface of the semiconductor wafer W held by the susceptor 74 through the opening 78, and measures the temperature of the wafer being increased. The measured temperature of the semiconductor wafer W is transmitted to the controller 3. The controller 3 controls output of the halogen lamps HL while monitoring the temperature of the semiconductor wafer W increased by irradiation with light from the halogen lamps HL to determine whether it has reached a predetermined preheat temperature T1. That is to say, the controller 3 performs feedback control of output of the halogen lamps HL based on a value measured by the radiation thermometer 20 so that the temperature of the semiconductor wafer W becomes the preheat temperature T1. The preheat temperature T1 is approximately 200° C. to 800° C. at which there is no possibility of diffusion of the impurities added to the semiconductor wafer W due to heat, and is preferably approximately 350° C. to 600° C. (600° C. in the present embodiment).

After the temperature of the semiconductor wafer W has reached the preheat temperature T1, the controller 3 maintains the semiconductor wafer W at the preheat temperature T1 for a while. Specifically, at a time point when the temperature of the semiconductor wafer W measured by the radiation thermometer 20 has reached the preheat temperature T1, the controller 3 adjusts output of the halogen lamps HL to maintain the semiconductor wafer W substantially at the preheat temperature T1.

The temperature of the semiconductor wafer W as a whole is uniformly increased to the preheat temperature T1 through preheating by the halogen lamps HL as described above. At the stage of preheating by the halogen lamps HL, the temperature at the periphery of the semiconductor wafer W where heat is more likely to be dissipated tends to be lower than the temperature in the central portion of the semiconductor wafer W, but the halogen lamps HL of the halogen heating unit 4 are denser in the region opposing the periphery than in the region opposing the central portion of the substrate W. The periphery of the semiconductor wafer W where heat is more likely to be dissipated can thus be irradiated with a greater amount of light to make in-plane temperature distribution of the semiconductor wafer W uniform at the preheating stage.

At a time point when a predetermined time has elapsed since reaching of the temperature of the semiconductor wafer W to the preheat temperature T1, the flash lamps FL of the flash heating unit 5 irradiate the front surface of the semiconductor wafer W held by the susceptor 74 with flashes of light. In this case, part of flashes of light radiated from the flash lamps FL is directly directed toward the inside of the chamber 6, the other part of flashes of light radiated from the flash lamps FL is once reflected by reflector 52 and is then directed toward the inside of the chamber 6, and thus the semiconductor wafer W is flash heated by irradiation with these flashes of light.

The semiconductor wafer W is flash heated through flash light irradiation by the flash lamps FL, and thus the temperature on the front surface of the semiconductor wafer W can be increased in a short time. That is to say, flashes of light emitted from the flash lamps FL are intense flashes of light having an extremely short irradiation time of approximately 0.1 ms or more and 100 ms or less obtained by converting electrostatic energy stored in advance in the capacitor into an extremely short light pulse. The temperature on the front surface of the semiconductor wafer W flashed heated through flash light irradiation by the flash lamps FL is momentarily increased to a processing temperature T2 of 1000° C. or more to activate the impurities implanted into the semiconductor wafer W, and is then rapidly decreased. As described above, the thermal processing apparatus 1 can increase and decrease the temperature on the front surface of the semiconductor wafer W in an extremely short time, and thus the impurities implanted into the semiconductor wafer W can be activated while suppressing diffusion of the impurities due to heat. A time required for activation of the impurities is extremely shorter than a time required for diffusion thereof due to heat, and thus activation is completed even in an extremely short time of approximately 0.1 ms to 100 ms in which diffusion does not occur.

The halogen lamps HL are turned off after a predetermined time has elapsed since the end of flash heating. The temperature of the semiconductor wafer W is thereby rapidly decreased from the preheat temperature T1. The temperature of the semiconductor wafer W being decreased is measured by the radiation thermometer 20, and a result of measurement is transmitted to the controller 3. The controller 3 monitors the result of measurement by the radiation thermometer 20 to determine whether the temperature of the semiconductor wafer W has been decreased to a predetermined temperature. After the temperature of the semiconductor wafer W has been decreased to the predetermined temperature or less, the pair of transfer arms 11 of the transfer mechanism 10 horizontally moves again from the withdrawal location to the transfer operation location and moves upward, so that the lift pins 12 protrude from the upper surface of the susceptor 74 to receive the semiconductor wafer W having been thermally processed from the susceptor 74. The transport opening 66 closed by the gate valve 185 is then opened, and the semiconductor wafer W mounted on the lift pins 12 is transported by the transport robot outside the apparatus to complete heating of the semiconductor wafer W by the thermal processing apparatus 1.

In the present embodiment, nitrogen gas is supplied from the gas ring 90 attached to the upper portion of the chamber side portion 61 to the chamber 6. Nitrogen gas supplied from the processing gas supply source 85 through the two gas supply tubes 83 is supplied through the gas supply inlets 82 to the flow path 97 in the gas ring 90. Nitrogen gas having flowed through the gas supply inlets 82 to the flow path 97 is introduced to the resisting unit in the flow path 97 through the plurality of introduction holes 93. Nitrogen gas supplied from outside the gas ring 90 encounters resistance of the labyrinthine resisting unit to have a reduced flow velocity, flows from an outer periphery to an inner periphery along the radial direction while diffusing along the circumferential direction of the gas ring 90, and is discharged through the slit-like gas discharge outlet 81 into the chamber 6. Nitrogen gas is thereby uniformly discharged through the gas discharge outlet 81 into the chamber 6 even if a large flow of nitrogen gas is supplied to the gas ring 90.

The lower ring 92 of the gas ring 90 has the cylindrical inner wall surface 92a located to be close to the semiconductor wafer W supported by the susceptor 74. The inner wall surface 92a of the lower ring 92 thus receives radiant heat from the semiconductor wafer W and the like heated by the halogen lamps HL. The amount of heat Q accumulated in the lower ring 92 of the gas ring 90 is herein expressed by an equation (1) below.

$$Q = Q_h - (Q_t + Q_c + Q_r) \quad (1)$$

In the equation (1), $Q_h$ is the amount of heat that the lower ring 92 receives from a surrounding environment, such as the semiconductor wafer W. $Q_t$ is the amount of heat transfer from the lower ring 92 to the surroundings, $Q_c$ is the amount of heat carried away from the lower ring 92 by convection in the chamber 6, and $Q_r$ is the amount of heat radiated from the lower ring 92. That is to say, a value obtained by subtracting the amount of heat $(Q_t + Q_c + Q_r)$ released from the lower ring 92 from the amount of heat $Q_h$ received by the lower ring 92 is the amount of heat Q accumulated in the lower ring 92.

On the other hand, the amount of heat Q accumulated in the lower ring 92 and the temperature of the lower ring 92 satisfy an equation (2) below.

$$Q = C \times (T2 - T1) \quad (2)$$

In the equation (2), C is the heat capacity of the lower ring 92, T2 is the temperature of the lower ring 92 after being increased, and T1 is the temperature of the lower ring 92 before being increased. The heat capacity C is expressed by the product of the mass m and the specific heat c of the lower ring 92. When the temperature T1 of the lower ring 92 before being increased is 23° C., the temperature T2 of the lower ring 92 after being increased is expressed by an equation (3) below.

$$T2 = \frac{Q}{C} + 23 \quad (3)$$

When the temperature T2 of the lower ring 92 after being increased exceeds a critical temperature $T_d$, the inner wall surface 92a of the lower ring 92 is discolored. Once the inner wall surface 92a of the lower ring 92 is discolored, reflectivity of the inner wall surface 92a is reduced, so that the amount of flashes of light emitted from the flash lamps FL and reflected by the inner wall surface 92a is reduced. As a result, illuminance of flashes of light applied to the semiconductor wafer W at flash light irradiation can be reduced to prevent the temperature on the front surface of the semiconductor wafer W from reaching the predetermined processing temperature T2.

It is thus necessary to prevent the temperature T2 of the lower ring 92 heated by the semiconductor wafer W and the like from exceeding the critical temperature $T_d$. As is obvious from the equation (3), it is necessary to increase the heat capacity C of the lower ring 92 and/or to reduce the amount of heat Q accumulated in the lower ring 92 to prevent the temperature T2 from exceeding the critical temperature $T_d$.

The heat capacity C of the lower ring 92 is the product of the mass m and the specific heat c of the lower ring 92. The specific heat c is a parameter specific to a material (stainless steel in the present embodiment) for the lower ring 92, and thus it is necessary to increase the mass m of the lower ring 92 to increase the heat capacity C. In the present embodiment, since the lower ring 92 is of the solid material having no space therein (FIG. 11), the lower ring 92 has a relatively large mass m, and thus has heat capacity C having a large value.

From among parameters appearing in the equation (1), the amount of heat $Q_h$ received by the lower ring 92, the amount of heat $Q_c$ carried away by convection, and the amount of radiated heat $Q_r$ have fixed values. It is thus necessary to increase the amount of heat transfer $Q_t$ from the lower ring 92 to the surroundings to reduce the amount of heat Q accumulated in the lower ring 92. In the present embodiment, the lower ring 92 is attached to the chamber side portion 61 being cooled to be in surface contact with the chamber side portion 61, so that thermal conductivity from the lower ring 92 to the chamber side portion 61 has a large value, and the lower ring 92 is effectively cooled. As a result, the amount of heat transfer $Q_t$ from the lower ring 92 to the surroundings can be increased to reduce the amount of heat Q accumulated in the lower ring 92.

As described above, in the gas ring 90 in the present embodiment, the heat capacity C of the lower ring 92 is increased, and the amount of heat Q accumulated in the lower ring 92 is reduced to suppress an increase in temperature T2 of the lower ring 92. The temperature T2 of the lower ring 92 thus does not exceed the critical temperature $T_d$ for discoloration, and discoloration of the inner wall surface 92a of the lower ring 92 can be prevented. In other words, the heat capacity C of the lower ring 92 and thermal conductivity from the lower ring 92 to the chamber side portion 61 have values not causing discoloration of the inner wall surface 92a of the lower ring 92 at irradiation with light from the halogen lamps HL. As a result, discoloration of the gas ring 90 can be prevented.

While the embodiment of the present invention has been described above, various modifications other than those described above can be made to the present invention without departing from the scope of the present invention. For example, in the above-mentioned embodiment, the resisting unit in the flow path 97 is the labyrinthine resisting unit including a combination of the plurality of concentric cylindrical walls, but the resisting unit is not limited to that having such a structure. The resisting unit in the flow path 97 may have a structure in which a plurality of columnar members are provided to stand, a structure in which a planar member having many through holes is provided, and the like, for example. Alternatively, the resisting unit in the flow path 97 may include a buffer as a space for temporarily storing gas. In short, the resisting unit in the flow path 97 may have any structure allowing for uniform supply of the processing gas supplied through the gas supply tubes 83 to the chamber 6.

In the above-mentioned embodiment, the flash heating unit 5 includes the 30 flash lamps FL, but the number of flash lamps FL is not limited to 30 and may be any number. The flash lamps FL are not limited to the xenon flash lamps, and may be krypton flash lamps. The number of halogen lamps HL included in the halogen heating unit 4 is also not limited to 40, and may be any number.

In the above-mentioned embodiment, the semiconductor wafer W is preheated using the filament halogen lamps HL as continuous illumination lamps continuously emitting light for one second or more, but lamps used for preheating are not limited to the halogen lamps HL, and, in place of the halogen lamps HL, discharge arc lamps (e.g., xenon arc lamps) may be used as the continuous illumination lamps to perform preheating.

The substrate to be processed by the thermal processing apparatus 1 is not limited to the semiconductor wafer, and may be a glass substrate for use in a flat panel display, such as a liquid crystal display, or a substrate for a solar cell.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus irradiating a substrate with light to heat said substrate, said thermal processing apparatus comprising:
    a chamber having a cylindrical side wall;
    a holding unit for holding said substrate in said chamber;
    a light irradiation unit irradiating said substrate with light;
    an annular gas ring attached to said side wall and directing processing gas supplied from outside said chamber into said chamber; and
    a cooling mechanism cooling said side wall, wherein
    said gas ring includes an annular upper ring and an annular lower ring,
    a gap between said upper ring and said lower ring provides a flow path for said processing gas,
    said lower ring has a cylindrical inner wall surface having a smaller diameter than said side wall,
    said inner wall surface of said lower ring is exposed to the thermal processing space in said chamber so that radiant heat from said substrate is transmitted, and
    at least said lower ring is in surface contact with said side wall.

2. The thermal processing apparatus according to claim 1, wherein
    said lower ring is of a solid material.

3. The thermal processing apparatus according to claim 1, wherein
    a labyrinthine resisting unit for reducing flow velocity of said processing gas is located in said flow path between said upper ring and said lower ring.

4. The thermal processing apparatus according to claim 3, wherein
    said gas ring has a plurality of introduction holes for introducing, to said resisting unit, said processing gas supplied through a gas supply inlet from outside said chamber, and intervals at which said plurality of introduction holes are arranged increases with increasing distance from said gas supply inlet.

5. The thermal processing apparatus according to claim 1, wherein
said light irradiation unit includes a continuous illumination lamp irradiating said substrate with light from below said chamber.

6. The thermal processing apparatus according to claim 5, wherein
said light irradiation unit includes a flash lamp irradiating said substrate with a flash of light from above said chamber.

7. A thermal processing apparatus irradiating a substrate with light to heat said substrate, said thermal processing apparatus comprising:
a chamber having a cylindrical side wall;
a holding unit for holding said substrate in said chamber;
a light irradiation unit irradiating said substrate with light;
an annular gas ring attached to said side wall and directing processing gas supplied from outside said chamber into said chamber; and
a cooling mechanism cooling said side wall, wherein
said gas ring includes an annular upper ring and an annular lower ring,
a gap between said upper ring and said lower ring provides a flow path for said processing gas,
said lower ring has a cylindrical inner wall surface having a smaller diameter than said side wall,
said inner wall surface of said lower ring is exposed to the thermal processing space in said chamber so that radiant heat from said substrate is transmitted, and
heat capacity of said lower ring and thermal conductivity from said lower ring to said side wall have values not causing discoloration of said inner wall surface of said lower ring through light irradiation by said light irradiation unit.

* * * * *